(12) United States Patent
Otsuka

(10) Patent No.: US 10,720,304 B2
(45) Date of Patent: Jul. 21, 2020

(54) CHARGED PARTICLE BEAM APPARATUS AND IMAGE ACQUISITION METHOD

(71) Applicant: JEOL Ltd., Tokyo (JP)

(72) Inventor: Takeshi Otsuka, Tokyo (JP)

(73) Assignee: JEOL Ltd., Tokyo (JP)

(*) Notice: Subject to any disclaimer, the term of this patent is extended or adjusted under 35 U.S.C. 154(b) by 0 days.

(21) Appl. No.: 16/420,502

(22) Filed: May 23, 2019

(65) Prior Publication Data

US 2019/0362930 A1 Nov. 28, 2019

(30) Foreign Application Priority Data

May 24, 2018 (JP) .................................. 2018-099634

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/244* (2013.01); *H01J 37/28* (2013.01); *H01J 2237/221* (2013.01)

(58) Field of Classification Search
CPC .......... H01J 37/00; H01J 37/02; H01J 37/222; G06T 2207/100056; G06T 2207/10061
USPC .......................................... 250/306, 307, 311
See application file for complete search history.

(56) References Cited

U.S. PATENT DOCUMENTS

| 5,051,585 A | * | 9/1991 | Koshishiba | ............... G03F 1/86 |
| | | | | 250/310 |
| 2011/0233399 A1 | * | 9/2011 | Ichimura | ............... H01J 37/244 |
| | | | | 250/307 |

FOREIGN PATENT DOCUMENTS

JP             765775 A          3/1995

* cited by examiner

*Primary Examiner* — Jason L McCormack
(74) *Attorney, Agent, or Firm* — The Webb Law Firm

(57) ABSTRACT

A charged particle beam apparatus acquires a scanned image by scanning a sample with a charged particle beam and detecting charged particles emitted from the sample. The charged particle beam apparatus includes: a plurality of detection units that detect charged particles emitted from the sample, and an image processing unit that generates the scanned image based on a plurality of detection signals outputted from the plurality of detection units. The image processing unit performs a process of acquiring the plurality of the detection signals at an irradiation position of the charged particle beam; a process of extracting a maximum value and a minimum value from among signal amounts of the plurality of the acquired detection signals, and calculating a difference between the maximum value and the minimum value; a process of calculating a sum total of the signal amounts of the plurality of the detection signals; and a process of determining a pixel value of a pixel of the scanned image corresponding to the irradiation position based on a sum of a first value that is obtained based on the sum total and a second value that is obtained based on the difference.

6 Claims, 6 Drawing Sheets

CHARGED PARTICLE BEAM APPARATUS AND IMAGE ACQUISITION METHOD

CROSS-REFERENCE TO RELATED APPLICATION

This application claims priority to Japanese Patent Application No. 2018-099634 filed May 24, 2018, the disclosure of which is hereby incorporated by reference in its entirety.

BACKGROUND OF THE INVENTION

Field of the Invention

The present invention relates to a charged particle beam apparatus and an image acquisition method.

Description of Related Art

In a scanning electron microscope (an example of a charged particle beam apparatus), a SEM image can be obtained by scanning a sample with a finely focused electron beam and detecting electrons emitted from the sample due to the incidence of electrons. In a typical SEM image, the compositional contrast of a sample and the topographic contrast of the sample surface are mixed.

For example, JP-A-7-65775 discloses a scanning electron microscope provided with a backscattered electron detector in which two detection elements are disposed symmetrically with respect to a hole through which an electron beam passes. In this scanning electron microscope, an SEM image (compositional image) in which the composition of the sample is strongly reflected can be obtained by adding the signals of the two detection elements, and an SEM image (topographic image) in which the unevenness of the sample is strongly reflected can be obtained by subtracting the signals of the two detection elements.

When observing the composition of the sample with a scanning electron microscope, the signals of the two detection elements are added, as described above, to acquire a compositional image. However, even when the compositional image is acquired by adding the signals of the two detection elements, where the sample surface has uneven, the topographic contrast appears in the compositional image.

With the conventional semiconductor detector used as a backscattered electron detector, electrons of relatively high energy of about 10 keV are detected, and electrons of lower energy are difficult to detect. Therefore, acquisition of a backscattered electron image is performed at a high acceleration voltage of 10 kV or more.

In recent years, semiconductor detectors that can detect electrons having relatively low energy of about 2 keV have appeared, and it has become possible to acquire a backscattered electron image at a low acceleration voltage. At a low acceleration voltage, the scattering area of electrons is narrower than at a high acceleration voltage, so it is possible to observe even a fine structure that could not be observed at a high acceleration voltage.

Meanwhile, a backscattered electron image obtained at a low acceleration voltage is more susceptible to the unevenness of the sample surface than a backscattered electron image obtained at a high acceleration voltage. In the case of a high acceleration voltage, the scattering area of the electrons is wide, so that the unevenness of the sample surface is smaller than the scattering area of the electrons, and the amount of emitted backscattered electrons is less susceptible to the unevenness. Meanwhile, in the case of a low acceleration voltage, the scattering area of the electrons is narrowed, so that the unevenness of the sample surface becomes large relative to the scattering area of the electrons, and the amount of emitted backscattered electrons is easily affected by the unevenness. Therefore, in the case of a low acceleration voltage, the topographic contrast is likely to appear in the compositional image.

SUMMARY OF THE INVENTION

The invention can provide a charged particle beam apparatus and an image acquisition method capable of acquiring a good compositional image by reducing the topographic contrast of the sample surface.

According to a first aspect of the invention, there is provided a charged particle beam apparatus that acquires a scanned image by scanning a sample with a charged particle beam and detecting charged particles emitted from the sample, the charged particle beam apparatus including:

a plurality of detection units that detect charged particles emitted from the sample; and an image processing unit that generates the scanned image based on a plurality of detection signals outputted from the plurality of the detection units, the image processing unit performing:

a process of acquiring the plurality of the detection signals at an irradiation position of the charged particle beam;

a process of extracting a maximum value and a minimum value from among signal amounts of the plurality of the acquired detection signals, and calculating a difference between the maximum value and the minimum value;

a process of calculating a sum total of the signal amounts of the plurality of the detection signals; and a process of determining a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the detection signals.

According to a second aspect of the invention, there is provided an image acquisition method used by a charged particle beam apparatus that acquires a scanned image by scanning a sample with a charged particle beam and detecting charged particles emitted from the sample with a plurality of detection units, the image acquisition method including:

acquiring a plurality of detection signals outputted from the plurality of the detection units at an irradiation position of the charged particle beam;

extracting a maximum value and a minimum value from among signal amounts of the plurality of the acquired detection signals, and calculating a difference between the maximum value and the minimum value;

calculating a sum total of the signal amounts of the plurality of the detection signals; and determining a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the detection signals.

DESCRIPTION OF THE INVENTION

Figure 1:
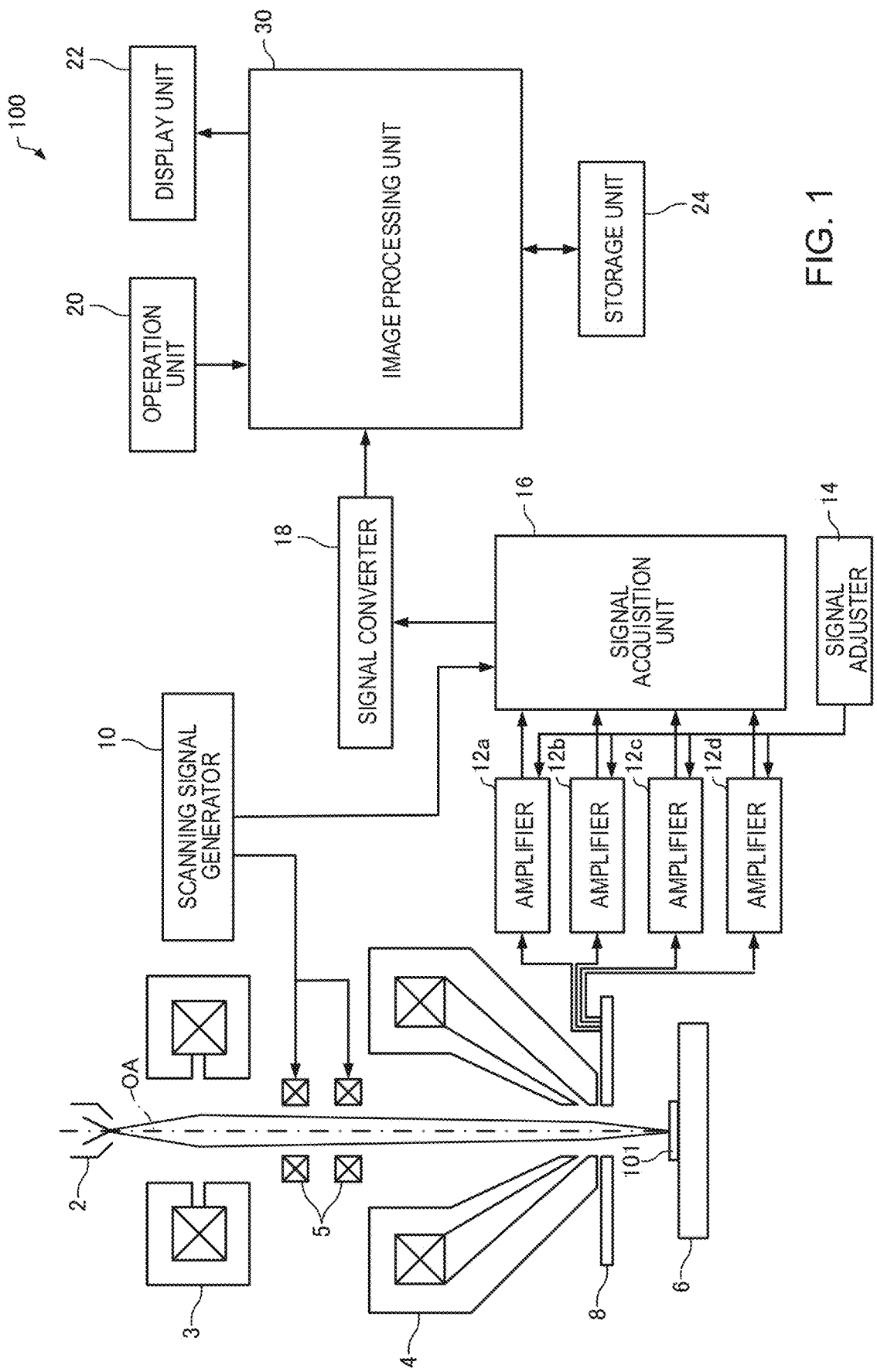
FIG. 1 illustrates a configuration of a scanning electron microscope according to one embodiment of the invention.

According to one embodiment of the invention, there is provided a charged particle beam apparatus that acquires a scanned image by scanning a sample with a charged particle beam and detecting charged particles emitted from the sample, the charged particle beam apparatus including:

a plurality of detection units that detect charged particles emitted from the sample; and an image processing unit that generates the scanned image based on a plurality of detection signals outputted from the plurality of the detection units, the image processing unit performing:

a process of acquiring the plurality of the detection signals at an irradiation position of the charged particle beam;

a process of extracting a maximum value and a minimum value from among signal amounts of the plurality of the acquired detection signals, and calculating a difference between the maximum value and the minimum value;

a process of calculating a sum total of the signal amounts of the plurality of the detection signals; and a process of determining a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the detection signals.

In such a charged particle beam apparatus, since the pixel value is obtained based on the sum of the first value based on the sum total and the second value based on the difference, a satisfactory compositional image with reduced topographic contrast can be acquired.

According to one embodiment of the invention, there is provided an image acquisition method used by a charged particle beam apparatus that acquires a scanned image by scanning a sample with a charged particle beam and detecting charged particles emitted from the sample with a plurality of detection units, the image acquisition method including:

acquiring a plurality of detection signals outputted from the plurality of the detection units at an irradiation position of the charged particle beam;

extracting a maximum value and a minimum value from among signal amounts of the plurality of the acquired detection signals, and calculating a difference between the maximum value and the minimum value;

calculating a sum total of the signal amounts of the plurality of the detection signals; and determining a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the detection signals.

With such an image acquisition method, since the pixel value is obtained based on the sum of the first value based on the sum total and the second value based on the difference, a satisfactory compositional image with reduced topographic contrast can be acquired.

Embodiments of the invention are described in detail below with reference to the drawings. Note that the following embodiments do not unduly limit the scope of the invention as stated in the claims. In addition, all of the elements described below are not necessarily essential requirements of the invention.

In the following, the charged particle beam apparatus according to the invention is exemplified by a scanning electron microscope that acquires a scanned image by irradiating with an electron beam and detecting electrons emitted from a sample. The charged particle beam apparatus according to the invention may be an apparatus that acquires a scanned image by irradiating with a charged particle beam (ion beam or the like) other than the electron beam and detecting charged particles emitted from the sample.

1. Configuration of Scanning Electron Microscope

First, a scanning electron microscope according to one embodiment of the invention will be described with reference to the drawings. FIG. 1 illustrates a configuration of a scanning electron microscope 100 according to one embodiment of the invention.

The scanning electron microscope 100 scans a sample 101 with an electron beam and detects electrons emitted from the sample 101 to acquire a scanned image. As illustrated in FIG. 1, the scanning electron microscope 100 includes an electron source 2, a converging lens 3, an objective lens 4, a scanning deflector 5, a sample stage 6, an electron detector 8, a scanning signal generator 10, amplifiers 12a, 12b, 12c, 12d, a signal adjuster 14, a signal acquisition unit 16, a signal converter 18, an operation unit 20, a display unit 22, a storage unit 24, and an image processing unit 30.

The electron source 2 generates electrons. The electron source 2 is, for example, an electron gun that accelerates electrons emitted from a cathode by an anode and emits an electron beam.

The converging lens 3 and the objective lens 4 converge the electron beam emitted from the electron source 2 to form an electron probe. The diameter of the electron probe and the probe current (amount of irradiation current) can be controlled with the converging lens 3.

The objective lens 4 is disposed immediately in front of the sample 101 to form the electron probe. The objective lens 4 includes, for example, a coil and a yoke. In the objective lens 4, magnetic field lines formed by the coil are confined in the yoke made of a high-permeability material such as iron, and a notch is formed in a part of the yoke, whereby the magnetic lines distributed at high density are caused to leak on an optical axis OA.

The scanning deflector 5 deflects the electron probe (converged electron beam) formed by the converging lens 3 and the objective lens 4. The scanning deflector 5 is used to scan the sample 101 with the electron probe. The scanning deflector 5 is driven in response to a scanning signal generated by the scanning signal generator 10 to deflect the electron beam. As a result, the sample 101 can be scanned with the electron probe.

The sample 101 is placed on the sample stage 6. The sample stage 6 supports the sample 101. The sample stage 6 has a drive mechanism for moving the sample 101.

The electron detector 8 detects the electrons (for example, backscattered electrons) emitted from the sample 101 due to irradiation of the sample 101 with the electron beam. The electron detector 8 is, for example, a semiconductor detector. The electron detector 8 is disposed between the objective lens 4 and the sample stage 6.

Figure 2:
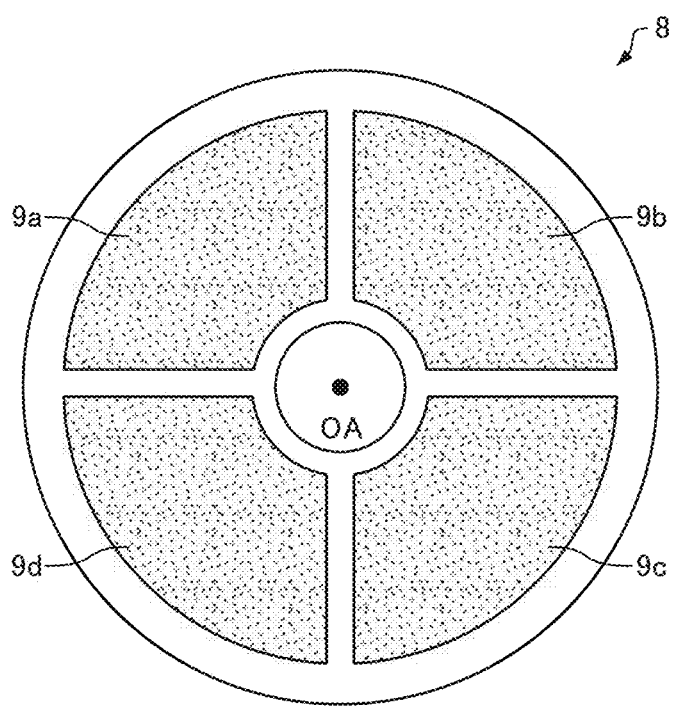
FIG. 2 is a plan view schematically illustrating an electron detector.

FIG. 2 is a plan view schematically illustrating the electron detector 8. As illustrated in FIG. 2, the electron detector 8 is a split detector having four detection areas (a first detection area 9a, a second detection area 9b, a third detection area 9c, and a fourth detection area 9d). The four detection areas 9a, 9b, 9c, 9d can detect electrons independently of one another. That is, each of the four detection areas 9a, 9b, 9c, 9d functions as a detection unit that outputs a detection signal of a signal amount corresponding to the amount of detected electrons. In the illustrated example, a first detection signal is outputted from the first detection area 9a, a second detection signal is outputted from the second detection area 9b, a third detection signal is outputted from the third detection area 9c, and a fourth detection signal is outputted from the fourth detection area 9d.

In the example in FIG. 2, the four detection areas 9a, 9b, 9c, 9d are formed by dividing the annular detection surface in the circumferential direction. The electron detector 8 is provided with a hole through which the electron beam passes. In the electron detector 8, the four detection areas 9a, 9b, 9c, 9d are arranged symmetrically with respect to the optical axis OA. The four detection areas 9a, 9b, 9c, 9d are arranged in a plane perpendicular to the optical axis OA. That is, the four detection areas 9a, 9b, 9c, 9d are arranged symmetrically with respect to the optical axis OA in a plane perpendicular to the optical axis OA. The areas of the four detection areas 9a, 9b, 9c, 9d are, for example, equal to one another.

The shape of the detector (detection surface) and the number of divisions are not limited to the example illustrated in FIG. 2. Further, instead of the split detector as the electron detector 8, a plurality of electron detectors each having a single detection area may be disposed. In this case, one electron detector constitutes one detection unit.

Further, in the example in FIG. 1, the electron detector 8 is disposed directly below the objective lens 4, but the position of the electron detector 8 is not particularly limited, provided that backscattered electrons emitted from the sample 101 can be detected.

For example, although not shown, in the case where a lens (so-called snorkel lens) having a resolution at a low acceleration voltage improved by actively generating the magnetic field of the lens up to the vicinity of the sample 101 is used as the objective lens 4 in the scanning electron microscope 100, the electron detector 8 may be disposed in the objective lens 4. This is because in this case, the electrons emitted from the sample 101 easily pass through the central hole of the objective lens 4 and reach the interior of the objective lens 4.

In the scanning electron microscope 100, the electron beam emitted from the electron source 2 is converged by the converging lens 3 and the objective lens 4 to form the electron probe, and the electron beam is deflected by the scanning deflector 5 to scan the sample 101 with the electron probe. As a result, electrons (for example, backscattered electrons) are emitted from the sample 101. The backscattered electrons emitted from the sample 101 are detected by the electron detector 8.

The detection signal outputted from the first detection area 9a is amplified by the amplifier 12a. The second detection signal outputted from the second detection area 9b is amplified by the amplifier 12b. The third detection signal outputted from the third detection area 9c is amplified by the amplifier 12c. The fourth detection signal outputted from the fourth detection area 9d is amplified by the amplifier 12d. The amplification factor and the offset amount of the detection signal in the amplifiers 12a, 12b, 12c, 12d are adjusted by the signal adjuster 14.

The signal acquisition unit 16 acquires the first to fourth detection signals amplified by the amplifiers 12a, 12b, 12c, 12d. Further, the signal acquisition unit 16 receives a scanning signal from the scanning signal generator 10 and acquires information on the irradiation position of the electron beam on the sample 101. In the signal acquisition unit 16, the first to fourth detection signals are associated with the information on the irradiation position of the electron beam. The signal acquisition unit 16 can be realized by, for example, a dedicated circuit.

The detection signal outputted from the signal acquisition unit 16 is converted by the signal converter 18 into a signal readable by the image processing unit 30.

The operation unit 20 performs the processing of converting an instruction from the user into a signal and sending the signal to the image processing unit 30. The operation unit 20 can be realized by, for example, an input device such as a button, a key, a touch panel display, or a microphone.

The display unit 22 outputs the image generated by the image processing unit 30. The display unit 22 can be realized by, for example, a display such as a liquid crystal display (LCD).

The storage unit 24 stores programs, data, and the like for the image processing unit 30 to perform various calculation processes. The storage unit 24 is also used as a work area of the image processing unit 30. The storage unit 24 can be realized by, for example, a random access memory (RAM), a read only memory (ROM), and a hard disk.

The image processing unit 30 generates a scanned image based on the first to fourth detection signals outputted from the four detection areas 9a, 9b, 9c, 9d.

Specifically, the image processing unit 30 performs a process of acquiring the first to fourth detection signals at each irradiation position of the electron beam; a process of extracting a maximum value of a signal amount and a minimum value of a signal amount from among the acquired first to fourth detection signals, and calculating a difference between the maximum value and the minimum value; a process of calculating a sum total of signal amounts of the plurality of the detection signals; and a process of determining a pixel value of a pixel corresponding to the irradiation position based on a sum of a first value based on the sum total and a second value based on the difference.

The functions of the image processing unit 30 can be realized by executing a program by various processors (central processing unit (CPU) or the like). At least a part of the functions of the image processing unit 30 may be realized by a dedicated circuit such as a gate array or the like (ASIC).

2. Image Acquisition Method

Next, a method for generating a scanned image will be described.

The signal amount of the first detection signal obtained at the irradiation position (x, y), which is one point on the sample 101, is denoted by a, the signal amount of the second detection signal is denoted by b, the signal amount of the third detection signal is denoted by c, and the signal amount of the fourth detection signal is denoted by d.

First, the maximum value S max(a, b, c, d) of the signal amount and the minimum value S min(a, b, c, d) of the signal amount are extracted from among the first to fourth detection signals obtained at the irradiation position (x, y). Then, the signal amount Sdiff=S max(a, b, c, d)−S min(a, b, c, d) of the difference between the maximum value S max(a, b, c, d) and the minimum value S min (a, b, c, d) is obtained.

Where the sample surface is flat (horizontal) at the irradiation position, electrons are detected equally in the four detection areas 9a, 9b, 9c, 9d, so the signal amounts of the first to fourth detection signals become substantially equal to each other, and the signal amount Sdiff is substantially zero.

Meanwhile, where the sample surface is tilted at the irradiation position, the signal amount of the detection signal in the detection area in the normal direction of the sample surface increases, and the detection signal in the detection area in the direction opposite to the normal direction decreases. Therefore, a difference occurs between the minimum value S min(a, b, c, d) and the maximum value S max(a, b, c, d). At this time, the signal amount Sdiff increases as the tilt angle increases. Therefore, the tilt of the sample surface can be detected by obtaining the signal amount Sdiff.

Next, the signal amount Stotal=a+b+c+d, which is the sum total of the signal amounts a, b, c, d of the first to fourth detection signals, is obtained. The signal amount Stotal is a signal similar to that of a generally used annular semiconductor detector, and thus the signal amount Stotal includes a signal of composition and a signal of tilt of the sample surface. Therefore, the scanned image generated by the signal amount Stotal is an image in which both the composition of the sample 101 and the unevenness of the sample surface are reflected.

The signal amount Stotal decreases as the tilt of the sample surface increases. Therefore, where the signal amount Stotal is corrected according to the value based on the signal amount Sdiff, the topographic contrast in the scanned image can be reduced.

For example, when the signal amount Sdiff increases in proportion to the tilt angle, and the sum total Stotal decreases in proportion to the tilt angle, the signal amount Sc (see the following formula) is obtained by multiplying the signal amount Sdiff by a coefficient K and then adding the product to the sum total Stotal as shown in the following formula.

$$Sc = Stotal + K \times Sdiff$$

The coefficient K is an arbitrary constant and may be set in advance. Alternatively, a scanned image is generated by taking the coefficient K as an arbitrary constant, the generated scan image is displayed on the display unit 22, and the user sets the coefficient K by viewing the scanned image displayed on the display unit 22. At this time, by repeating the generation of the scanned image and the setting of the coefficient K, a satisfactory scanned image can be obtained.

Next, the pixel value of the pixel corresponding to the irradiation position (x, y) is determined based on the signal amount Sc. Here, since the scanned image is represented in a gray scale, the pixel value is a luminance value. The luminance value is determined according to the signal amount Sc, as in the case of generating the usual SEM image. For example, the luminance value of the pixel is determined as being proportional to the signal amount.

In this way, by obtaining the pixel values for all the pixels that constitute the scanned image, it is possible to obtain a scanned image with a reduced topographic contrast.

The offset amount Os of the signal may be changed according to the signal amount Sdiff as in the following formula.

$$Sc = Stotal + K \times (Sdiff + Os)$$

Thereby, the topographic contrast can be further reduced.

Explained hereinabove is the case where the signal amount Sdiff increases in proportion to the tilt angle, and the signal amount Stotal decreases in proportion to the tilt angle, but such relationships are valid when the tilt angle of the sample surface is comparatively small. When the tilt of the sample surface is large, there can be significant deviations from these relationships. Therefore, when the tilt of the sample surface is large, a polynomial having the signal amount Sdiff as a variable may be added to the signal amount Stotal as shown in the following formula.

$$Sc = Stotal + f(Sdiff)$$

For example, $f(Sdiff) = C1 \times Sdiff^2 + C2 \times Sdiff + C3$ may be used. Here, C1, C2, and C3 are arbitrary constants.

Hereinafter, the reason why the scanned image in which the topographic contrast is reduced can be obtained by the above-described method will be described.

First, the relationship between the unevenness of the sample surface and the signal amount will be described.

The relationship between the emission rate of the backscattered electrons and the tilt angle of the sample surface is such that the emission rate is maximum when the sample surface is horizontal (when the tilt angle is zero), and decreases as the tilt angle of the sample surface increases.

Figure 3:
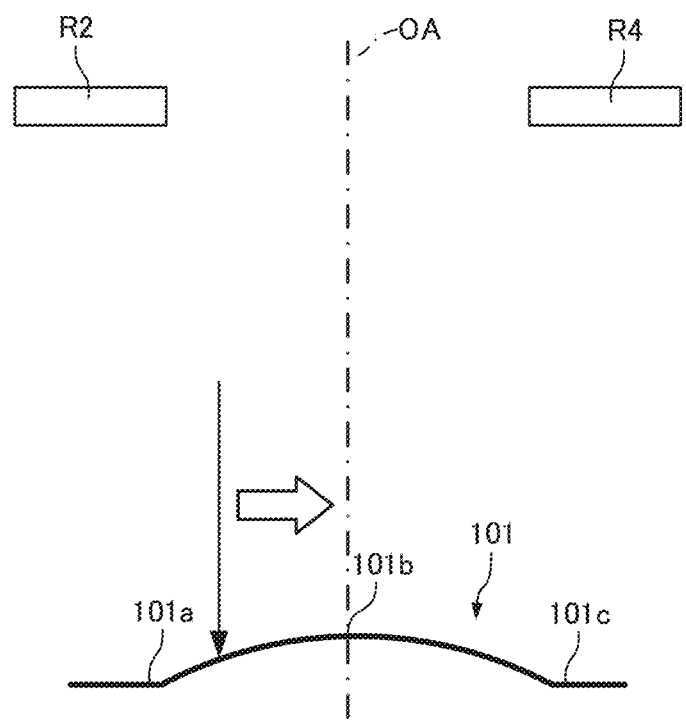
FIG. 3 is a diagram for explaining the relationship between unevenness of a sample surface and a signal amount.
Figure 4:
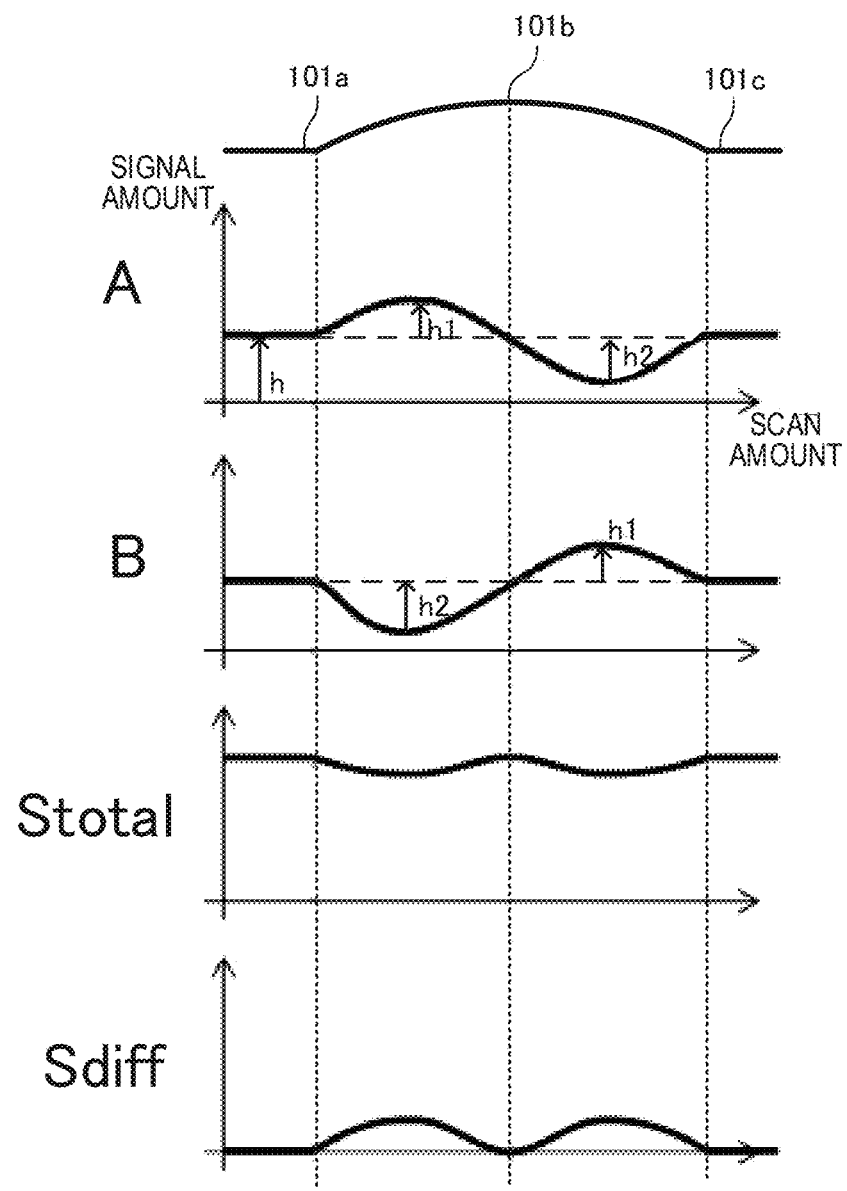
FIG. 4 is a diagram for explaining the relationship between unevenness of a sample surface and a signal amount.

FIG. 3 and FIG. 4 are diagrams for explaining the relationship between unevenness of the sample surface and the signal amount. Here, for convenience, it is assumed that the electron detector has two detection areas (detection area R2 and detection area R4).

As illustrated in FIG. 3, the detection area R2 and the detection area R4 are disposed at symmetrical positions with respect to the optical axis OA. In an actual apparatus, since the electron detector is sufficiently larger than the electron scan area, and the detection area R2 and the detection area R4 are symmetrical with respect to the electron emission point, the detection area R2 and the detection area R4 detect electrons in substantially the same angular range. Therefore, where the sample surface is flat (horizontal), the same amount of electrons is incident on the detection area R2 and the detection area R4.

FIG. 4 illustrates the signal amount A in the detection area R2 and the signal amount B in the detection area R4 when scanning with an electron beam is performed from a flat first portion 101a to a flat second portion 101c through a convex vertex 101b.

The signal amount A in the detection area R2 increases as the electron beam travels from the first portion 101a toward the convex vertex 101*b*, and decreases as the electron beam travels from the vertex 101*b* toward the second portion 101*c*.

Meanwhile, the signal amount B in the detection area R4 decreases as the electron beam travels from the first portion 101*a* to the vertex 101*b*, and increases as the electron beam travels from the vertex 101*b* to the second portion 101*c*.

Here, the emission rate of the backscattered electrons is maximum when the sample surface is horizontal, and decreases as the tilt angle of the sample surface increases. Therefore, where the increase amount of the signal amount that has been increased by the tilt of the sample surface is denoted by h1 and the decrease amount of the signal amount that has decreased is denoted by h2 with respect to the signal amount h when the sample surface is horizontal, the respective absolute values become |h1|<|h2|. Therefore, even when the signal amount A and the signal amount B are added, as illustrated in FIG. 4, the signal amount A+B does not become flat, and the signal amount decreases where there is a tilt.

Therefore, in the above embodiment, the tilt information on the sample surface is acquired based on the signal amount A and the signal amount B.

Specifically, first, the signal amount A and the signal amount B are compared, and the maximum value S max(A, B) of the signal amount and the minimum value S min(A, B) of the signal amount are extracted while scanning the electron beam. Since the signal amount A is larger than the signal amount B between the first portion 101*a* and the vertex 101*b*, the maximum value S max(A, B) becomes the signal amount A, and the minimum value S min(A, B) becomes the signal amount B. Further, since the signal amount B is larger than the signal amount A between the vertex 101*b* and the second portion 101*c*, the maximum value S max(A, B) becomes the signal amount B, and the minimum value S min(A, B) becomes the signal amount A. Further, in the first portion 101*a* and the second portion 101*c*, since the signal amount A and the signal amount B are equal, the maximum value S max(A, B) and the minimum value S min(A, B) become the same value. When the signal amount A and the signal amount B are the same value, the maximum value S max(A, B) and the minimum value S min(A, B) may be either value.

Next, the difference between the maximum value S max(A, B) and the minimum value S min(A, B) is determined. The extracted maximum value S max(A, B) and minimum value S min(A, B) satisfy the relationship: maximum value S max(A, B)≥minimum value S min(A, B) at all times, so that the signal amount Sdiff=S max(A, B)−S min(A, B), which is the subtraction result, is a positive number or zero. The signal amount Sdiff becomes substantially zero when the sample surface is horizontal, and the value thereof becomes larger as the tilt of the sample surface increases. Therefore, the magnitude of the tilt of the sample surface can be determined from the signal amount Sdiff.

The change in the signal amount due to the composition is not affected by the tilt of the sample surface. Therefore, the signal amount Sdiff does not include information on the composition.

Here, as illustrated in FIG. 4, the signal amount Stotal=A+B decreases as the tilt angle of the sample surface increases, whereas the signal amount Sdiff=S max(A, B)−S min(A, B) increases as the tilt angle of the sample surface increases. Therefore, by adding the value (first value) based on the signal amount Stotal and the value (second value) based on the signal amount Sdiff, the change of the signal amount due to the tilt of the sample surface is canceled, and it is possible to obtain a scanned image with reduced influence of the unevenness of the sample surface.

3. Processing

Figure 5:
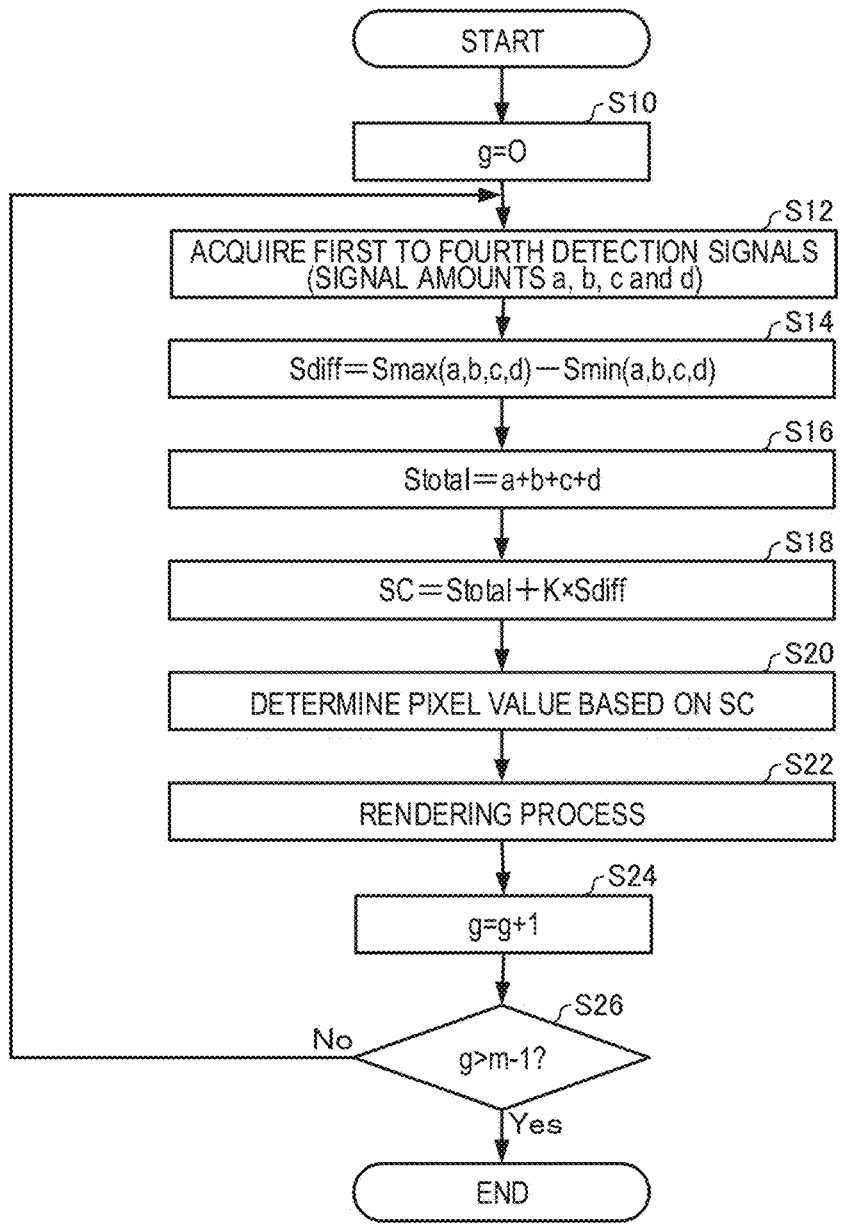
FIG. 5 is a flowchart illustrating an example of the process of generating a scanned image in the image processing device.

Next, processing in the image processing unit 30 will be described. FIG. 5 is a flowchart illustrating an example of processing of generating a scanned image performed by the image processing unit 30. Here, it is assumed that the scanned image is constituted by the first to m-th pixels represented as the g-th pixel (g=0, 1, 2, . . . , m−1).

First, for g=0 (S10), the first detection signal, the second detection signal, the third detection signal, and the fourth detection signal at the irradiation position corresponding to the g-th pixel (g=0) are obtained (S12).

Next, the maximum value S max(a, b, c, d) of the signal amount and the minimum value S min(a, b, c, d) of the signal amount are extracted from among the first to fourth detection signals acquired in step S10, and the signal amount Sdiff=S max(a, b, c, d)−S min(a, b, c, d), which is the difference between the maximum value S max(a, b, c, d) and the minimum value S min(a, b, c, d), is calculated (S14).

Next, the signal amount Stotal=a+b+c+d, which is the sum total of the signal amounts of the first to fourth detection signals acquired in step S10 is calculated (S16).

Next, the signal amount Sc=Stotal+K×Sdiff is calculated by adding the signal amount Sdiff multiplied by the coefficient K to the signal amount Stotal (S18).

Next, a pixel value (luminance value) is obtained based on the signal amount Sc (S20).

Next, a process (rendering process) is performed to control the display unit 22 so that the area corresponding to the g-th pixel (g=0) is displayed with the obtained luminance value in the display unit 22 (S22). Thus, the area corresponding to the g-th pixel (g=0) of the display unit 22 is displayed with the obtained luminance value.

Next, g=g+1 is set (S24), the process returns to step S12, and similarly, the pixel value of the g-th pixel (g=1) is determined (S14, S16, S18, S20), and the rendering process (S22) is performed. These processes are repeated until g>m−1 (S26).

The scanned image can be displayed on the display unit 22 by the above processing. In this way, the scanned image can be generated.

The process of generating the scanned image may be performed in parallel with the scanning of the electron beam. As a result, the scanned image of the sample 101 can be displayed on the display unit 22 in real time.

A scanned image may be also generated by initially generating an SEM image (see FIG. 6) by the first detection signal, generating an SEM image (see FIG. 7) by the second detection signal, generating an SEM image (see FIG. 8) by the third detection signal, and generating an SEM image (see FIG. 9) by the fourth detection signal, then acquiring information on the signal amounts a, b, c, d for each pixel from the four generated SEM images, and performing the same processing as illustrated in FIG. 5.

Figure 6:
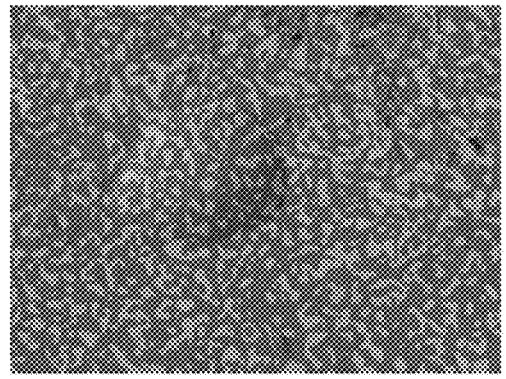
FIG. 6 is a SEM image generated by a first detection signal of a first detection area.
Figure 7:
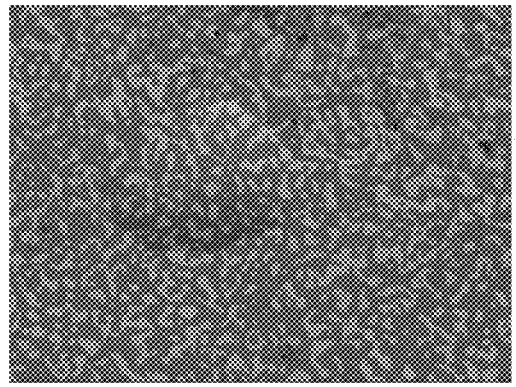
FIG. 7 is a SEM image generated by a second detection signal of a second detection area.
Figure 8:
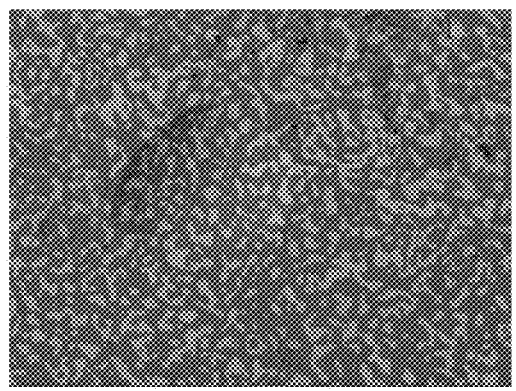
FIG. 8 is a SEM image generated by a third detection signal of a third detection area.
Figure 9:
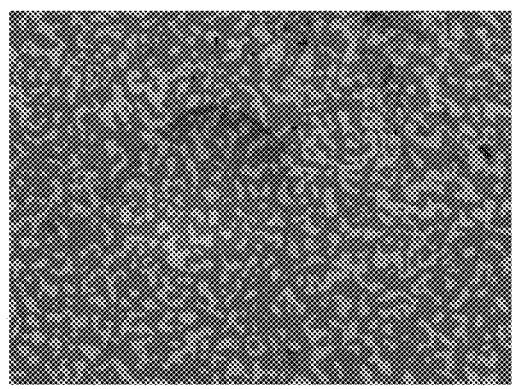
FIG. 9 is a SEM image generated by a fourth detection signal of a fourth detection area.

FIG. 6 is an SEM image generated by the first detection signal (signal amount a). FIG. 7 is an SEM image generated by the second detection signal (signal amount b). FIG. 8 is an SEM image generated by the third detection signal (signal amount c). FIG. 9 is an SEM image generated by the fourth detection signal (signal amount d).

Comparing the four SEM images illustrated in FIG. 6 to FIG. 9, the compositional contrast is the same but the topographic contrast is different. This is due to the illumination effect.

Figure 10:
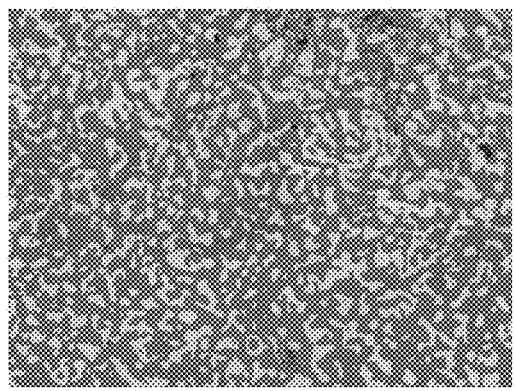
FIG. 10 is a compositional image generated by a signal amount Stotal.

FIG. 10 is a scanned image (compositional image) generated by the signal amount Stotal=a+b+c+d. In the compositional image in FIG. 10, the compositional contrast is obtained, but the topographic contrast can be confirmed near the center of the visual field.

Figure 11:
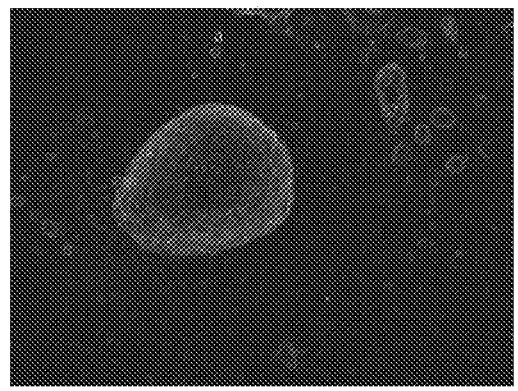
FIG. 11 is a tilt image generated by a signal amount Sdiff.

FIG. 11 is a scanned image (tilted image) generated by the signal amount Sdiff=S max(a, b, c, d)−S min(a, b, c, d). In the tilted image in FIG. 11, it can be seen that there is a depression or a protrusion near the center of the visual field.

Figure 12:
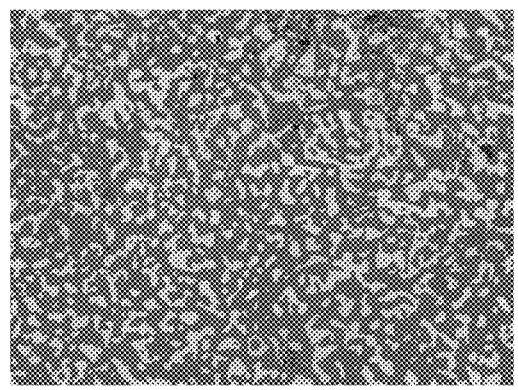
FIG. 12 is a scanned image generated with a signal amount Sc.

FIG. 12 is a scanned image generated by the signal amount Stotal+K×Sdiff. In the scanned image in FIG. 12, the topographic contrast is reduced as compared with the compositional image in FIG. 10.

4. Features

The scanning electron microscope 100 has, for example, the following features.

In the scanning electron microscope 100, the image processing unit 30 performs a process of acquiring the plurality of the detection signals at each irradiation position of the electron beam; a process of extracting the maximum value S max of a signal amount and the minimum value S min of a signal amount from among the plurality of the acquired detection signals, and calculating a difference Sdiff between the maximum signal value and the minimum signal value; a process of calculating the sum total Stotal of signal amounts of the plurality of the detection signals; and a process of determining the pixel value of a pixel corresponding to the irradiation position based on a sum of the first value (sum total Stotal) based on the sum and the second value (K×Sdiff, or f(Sdiff)) based on the difference.

Therefore, in the scanning electron microscope 100, as described above, a satisfactory scanned image (compositional image) in which the topographic contrast is reduced can be acquired.

In the scanning electron microscope 100, since the plurality of the detection areas 9a, 9b, 9c, 9d are arranged symmetrically with respect to the optical axis OA, the calculation for obtaining the pixel value from the detection signal can be simplified.

In the scanning electron microscope 100, the signal amount Sc is determined by Sc=Stotal+K×Sdiff, and the pixel value is determined based on the signal amount Sc. Therefore, in the scanning electron microscope 100, a scanned image in which the topographic contrast is reduced can be acquired.

In the scanning electron microscope 100, in the process of determining the pixel value, the second value is calculated using a polynomial f(Sdiff) with the signal amount Sdiff of the difference as a variable. Therefore, in the scanning electron microscope 100, a scanned image in which the topographic contrast is reduced can be acquired.

In the scanning electron microscope 100, the image processing unit 30 performs a process of acquiring the first to fourth detection signals in parallel with the scanning of the electron beam; a process of calculating the signal amount Sdiff of the difference; a process of determining the signal amount Stotal of the sum total; and a process of obtaining a pixel value based on the signal amount Sc. Therefore, in the scanning electron microscope 100, a scanned image in which the topographic contrast is reduced can be acquired in a short time.

The above-described embodiments and modifications are examples and the invention is not limited thereto. For example, the embodiments and the modifications may be combined appropriately.

For example, in the embodiment described above, the signal amount Sc is calculated by adding the second value (K×Sdiff) based on the difference to the sum total Stotal as the first value, but the signal amount Sc may be also calculated, for example, by adding the second value to a first value (K'×Stotal) obtained by multiplying the sum total Stotal by an arbitrary coefficient K'.

Further, for example, although the case where the electron detector 8 has four detection areas 9a, 9b, 9c, 9d is described above, the number of detection areas in the electron detector 8 may be two or more, and preferably three or more.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

The invention claimed is:

1. A charged particle beam apparatus that acquires a scanned image by scanning a sample with a charged particle beam and detecting charged particles emitted from the sample, the charged particle beam apparatus comprising:
    a plurality of detection units that detect charged particles emitted from the sample; and
    an image processing unit that generates the scanned image based on a plurality of detection signals outputted from the plurality of detection units,
    the image processing unit configured to:
    acquire the plurality of detection signals at an irradiation position of the charged particle beam;
    extract a maximum value and a minimum value from among signal amounts of the plurality of acquired detection signals, and calculating a difference between the maximum value and the minimum value;
    calculate a sum total of the signal amounts of the plurality of detection signals; and
    determine a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the plurality of detection signals.

2. The charged particle beam apparatus according to claim 1, wherein
    the plurality of detection units are arranged symmetrically with respect to an optical axis.

3. The charged particle beam apparatus according to claim 1, wherein,
    when determining the pixel value, a signal amount Sc is determined by the following formula $Sc = Stotal + K \times Sdiff$ where Stotal is the sum total of the signal amounts of the plurality of detection signals, Sdiff is the difference between the maximum value and the minimum value of the detection signals, and K is a coefficient, and the pixel value is determined based on the signal amount Sc.

4. The charged particle beam apparatus according to claim 1, wherein,
when determining the pixel value, the second value is calculated by a polynomial having the difference as a variable.

5. The charged particle beam apparatus according to claim 1, wherein
the image processing unit is configured to acquire the plurality of detection signals, calculate the difference, calculate the sum total, and determine the pixel value in parallel with the scanning with the charged particle beam.

6. An image acquisition method used by a charged particle beam apparatus that acquires a scanned image by scanning a sample with a charged particle beam and detecting charged particles emitted from the sample with a plurality of detection units, the image acquisition method comprising:

acquiring a plurality of detection signals outputted from the plurality of detection units at an irradiation position of the charged particle beam;

extracting a maximum value of a signal amount and a minimum value of a signal amount from among signal amounts of the plurality of acquired detection signals, and calculating a difference between the maximum value and the minimum value;

calculating a sum total of the signal amounts of the plurality of detection signals; and determining a pixel value of a pixel of the scanned image corresponding to the irradiation position based on a sum of a first value that is obtained based on the sum total of the signal amounts of the detection signals and a second value that is obtained based on the difference between the maximum value and the minimum value of the signal amounts of the plurality of detection signals.

* * * * *